(12) United States Patent
You et al.

(10) Patent No.: US 8,026,169 B2
(45) Date of Patent: Sep. 27, 2011

(54) CU ANNEALING FOR IMPROVED DATA RETENTION IN FLASH MEMORY DEVICES

(75) Inventors: Lu You, San Jose, CA (US); Alexander Nickel, Santa Clara, CA (US); Minh Q. Tran, Milpitas, CA (US); Minh-Van Ngo, Fremont, CA (US); Hieu Pham, Milpitas, CA (US); Erik Wilson, Santa Clara, CA (US); Hirokazu Tokuno, Cupertino, CA (US); Amir Hossein Jafarpour, Pleasanton, CA (US); Inkuk Kang, San Jose, CA (US); Robert Huertas, Hollister, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 11/593,086

(22) Filed: Nov. 6, 2006

(65) Prior Publication Data
US 2008/0108193 A1 May 8, 2008

(51) Int. Cl.
*H01L 21/4763* (2006.01)

(52) U.S. Cl. ............... 438/637; 438/638; 257/E21.476
(58) Field of Classification Search ................. 438/637, 438/638, 639, 687, 622, 624
See application file for complete search history.

(56) References Cited

U.S. PATENT DOCUMENTS

| | | | |
|---|---|---|---|
| 6,342,444 B1 * | 1/2002 | Higashi et al. | 438/627 |
| 6,368,967 B1 | 4/2002 | Besser | |
| 6,391,777 B1 * | 5/2002 | Chen et al. | 438/687 |
| 6,566,248 B1 * | 5/2003 | Wang et al. | 438/629 |
| 6,797,652 B1 * | 9/2004 | Ngo et al. | 438/687 |
| 6,979,625 B1 * | 12/2005 | Woo et al. | 438/309 |
| 7,091,088 B1 * | 8/2006 | Cheng et al. | 438/257 |

* cited by examiner

*Primary Examiner* — Phat Cao
*Assistant Examiner* — Nga Doan
(74) *Attorney, Agent, or Firm* — Volpe and Koenig, P.C.

(57) ABSTRACT

Data retention in flash memory devices, such as mirrorbit devices, is improved by reducing the generation and/or diffusion of hydrogen ions during back end processing, such as annealing inlaid Cu. Embodiments include annealing inlaid Cu in an $N_2$ atmosphere containing low $H_2$ or no $H_2$, and at temperatures less than 200° C., e.g., 100° C. to 150° C.

6 Claims, 4 Drawing Sheets

CU ANNEALING FOR IMPROVED DATA RETENTION IN FLASH MEMORY DEVICES

FIELD OF THE INVENTION

The present invention relates to a method of manufacturing semiconductor memory devices exhibiting high reliability and improved data retention. The present invention is particularly applicable to manufacturing high-speed integrated circuits in flash memory devices, with reduced charge loss.

BACKGROUND OF THE INVENTION

Semiconductor memory devices, such as erasable, programmable, read-only memories (EPROMs), electrically erasable programmable read-only memories (EEPROMs), and flash erasable programmable read-only memories (FEPROMs) are erasable and reusable, and are employed in various commercial electronic devices, such as computers, cellular telephones and digital cameras. There has recently evolved flash memory devices termed mirrorbit devices, which do not contain a floating gate electrode. In mirrorbit devices, the gate electrode is spaced apart from the substrate by an oxide/nitride/oxide (ONO) stack, such as a silicon oxide/silicon nitride/silicon oxide stack. In such devices the charge is contained within the nitride layer of the ONO stack. The relentless drive for miniaturization has led to the fabrication of flash memory devices comprising transistors having a gate width of about 150 nm and under, and gate structures spaced apart by a gap of 225 nm or less. Conventional practices comprise forming a sidewall spacer on side surfaces of the gate stack, thereby reducing the gate gap to about 25 nm.

As device dimensions shrink into the deep sub-micron regime, vulnerability to mobile ion contamination, such as hydrogen degradation, increases. The inability to adequately getter or reduce the generation of mobile ion contaminants, such as hydrogen ions, results in a neutralization of electrons and, hence, leakage causing programming loss as well as a charge gain causing reappearance of erased information.

As device features plunge into the deep submicron regime, interconnect technology is transitioning from aluminum-based to copper-based metallurgy. This technological evolution has come about through the adoption of damascene and dual-damascene process flows involving electrolytic copper plating and chemical mechanical polishing (CMP) techniques. The technological benefits of Cu, such as reduced RxC delay are clear; however, various reliability issues have evolved. For example, due to Cu diffusion through interlayer dielectric materials, such as silicon dioxide, Cu interconnect structures must be encapsulated by a diffusion barrier layer. Typical diffusion barrier metals include tantalum (Ta), tantalum nitride (TaN), titanium nitride (TiN), titanium (Ti), titanium-tungsten (TiW), tungsten (W), tungsten nitride (WN), Ti—TiN, titanium silicon nitride (TiSiN), tungsten silicon nitride (WSiN), tantalum silicon nitride (TaSiN) and silicon nitride for encapsulating Cu. The use of such barrier materials to encapsulate Cu is not limited to the interface between Cu and the dielectric interlayer, but includes interfaces with other metals as well.

There are additional problems attendant upon conventional Cu interconnect methodology employing a diffusion barrier layer (capping layer). For example, conventional practices comprise forming a damascene opening in an interlayer dielectric, depositing a barrier layer, such as TaN, lining the opening and on the surface of the interlayer dielectric, filling the opening with Cu or a Cu alloy layer, implementing CMP, and forming a silicon nitride capping (diffusion barrier) layer on the exposed surface of the Cu or Cu alloy. It was found, however, that oxides on the upper surface of the inlaid Cu or Cu alloy can prevent adequate adhesion of the capping layers. Consequently, the capping layer is vulnerable to removal, as by peeling due to scratching or stresses resulting from subsequent deposition of layers. As a result, the Cu or Cu alloy is not entirely encapsulated and Cu diffusion occurs, thereby adversely affecting device performance and decreasing electromigration and stress migration resistance.

In applying Cu interconnect technology to flash memory devices, additional problems occur, particularly as dimensions shrink into the deep sub-micron regime. A Cu or Cu alloy is typically deposited in an opening formed in an inter-layered dielectric (ILD), such as a dual damascene opening comprising a lower via or contact hole connected to an upper trench, forming an overburden. Chemical mechanical polishing (CMP) is implemented such that the overburden is planarized and the upper surface of the inlaid copper is substantially coplanar with the upper surface of the ILD. In accordance with conventional practices, the inlaid Cu or Cu alloy is annealed to allow grain growth in the deposited copper, thereby relieving stress accumulated during damascene filling. Conventionally, such annealing is conducted in a forming gas atmosphere comprising nitrogen ($N_2$) and about 4 vol. % hydrogen ($H_2$) at a temperature of about 250° C. However, it was found that such back end processing generated and/or accelerated the diffusion of hydrogen ions into underlying flash memory devices adversely impacting data retention by causing a charge loss.

Accordingly, there exists a need for a method of fabricating semiconductor memory devices with improved reliability, increased operating speed and reduced leakage. There exists a particular need for methodology enabling the fabrication of flash memory devices, such as microbit devices, with improved data retention and improved reliability, and Cu interconnects.

DISCLOSURE OF THE INVENTION

An advantage of the present invention is a method of fabricating semiconductor memory devices, such as flash memory devices, with improved data retention, and comprising reliable Cu interconnects.

Additional advantages and other features of the present invention will be set forth in the description which follows and in part will be apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a method of fabricating a semiconductor device, the method comprising: depositing a layer of copper (Cu) or Cu alloy; and annealing the deposited layer of Cu or Cu alloy in an atmosphere of nitrogen ($N_2$) and 0 to 1 vol. % hydrogen ($H_2$).

Embodiments include annealing the deposited layer of Cu or Cu alloy in an atmosphere of $N_2$ without the presence of $H_2$, and at a temperature of about 100° C. up to less than 200° C., e.g., about 100° C. to about 150° C. Embodiments further include depositing the layer of Cu or Cu alloy in an opening formed in a dielectric layer having a dielectric constant (k) of less than or equal to 3.9, and conducting CMP such that the upper surface of the inlaid Cu or Cu alloy is substantially coplanar with the upper surface of the dielectric layer, and conducting the annealing before or after conducting CMP.

Another advantage of the present invention is a method of fabricating a semiconductive devices, the method comprising: depositing a layer of copper (Cu) or a Cu alloy; conducting a first anneal by heating the deposited layer of Cu or Cu alloy in an atmosphere of nitrogen ($N_2$) and 0 to 4 vol. % hydrogen ($H_2$) at a temperature of about 100° C. up to less than 200° C., for up to five minutes; and, subsequently, conducting a second anneal by heating the deposited layer of Cu or Cu alloy in $N_2$ and 0 to 1 vol. % $H_2$ at a temperature of 100° C. to less than 200° C.

Embodiments include conducting the second anneal by heating in an atmosphere of $N_2$ without $H_2$, at a temperature of about 100° C. to about 150° C. Embodiments further include depositing the layer of Cu or Cu alloy in an opening formed in a dielectric layer having a dielectric constant (k) of no greater than 3.9 forming an overburden and then conducting CMP, and conducting the first and second anneals after conducting CMP.

Embodiments of the present invention are applicable to fabricating all types of semiconductor devices, including flash memory devices, such as conventional flash memory devices having floating gate electrodes. The present invention is particularly applicable to flash memory mirrorbit devices having a gate dielectric layer comprising an ONO stack.

Additional advantages of the present invention will become readily apparent to those skilled in this art from the following detailed description wherein embodiments of the present invention are described simply by way of illustration of the best mode contemplated to carry out the present invention. As will be realized, the present invention is capable of other and different embodiments, and its several details are capable of modifications in various obvious respects, all without departing from the present invention. Accordingly, the drawings and description are to be regarded as illustrative in nature, and not as restrictive.

BRIEF DESCRIPTION OF THE DRAWINGS

In FIGS. 1 through 4, similar reference characters denote similar features.

DESCRIPTION OF THE INVENTION

Figure 1:
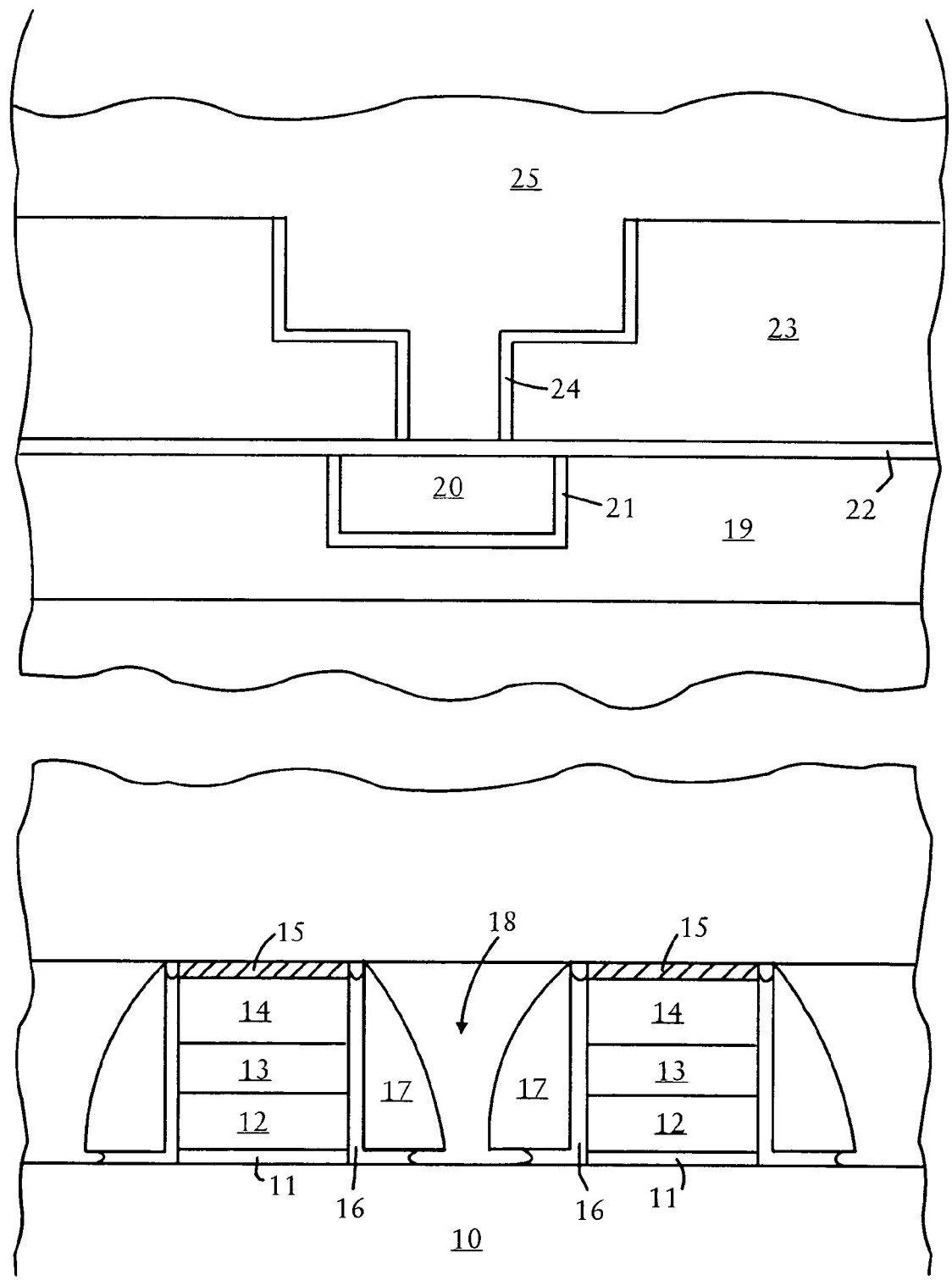
FIGS. 1 and 2 schematically illustrate an embodiment of the present invention.

The present invention addresses and solves various reliability problems attendant upon conventional techniques for fabricating flash memory devices. These problems arise as semiconductor memory device dimensions continue to shrink, making it increasingly more difficult to effectively getter, reduce the generation of, and prevent the diffusion of mobile ion contaminants, such as hydrogen ions. The hydrogen ion contamination problem becomes exacerbated when integrating back end Cu interconnect technology with flash memory devices. During conventional back end processing, inlaid Cu is typically annealed in a forming gas atmosphere containing $N_2$ and about 4 vol. % $H_2$ at a temperature of about 250°. However, it was found that this process not only generated hydrogen ions but also accelerated the diffusion of hydrogen ions into the underlying devices, resulting in charge loss, adversely impacting data retention.

The present invention addresses and solves such data retention problems stemming from the generation and diffusion of hydrogen ions during Cu annealing to effect grain growth and relieve stress resulting from damascene filling. Further, the present invention provides methodology enabling such a reduction in the generation and diffusion of hydrogen ions while, at the same time, enabling adequate adhesion of a capping layer, such as silicon nitride, to the inlaid Cu.

In accordance with embodiments of the present invention, Cu annealing is strategically conducted in an atmosphere of reduced $H_2$ and/or at a lower temperature, thereby significantly reducing the generation of hydrogen ions and/or diffusion of hydrogen ions to underlying devices. In accordance with embodiments of the present invention, Cu annealing is conducted at in an $N_2$ atmosphere containing a reduced amount of $H_2$, such as no greater than 1 vol. %, e.g., in the absence of $H_2$. The annealing temperature is also reduced, thereby reducing hydrogen ion diffusion. For example, embodiments of the present invention include annealing at a temperature of less than about 200° C., e.g., about 100° C. to about 150° C.

In another embodiment of the present invention, a first annealing step is conducted at a temperature less than about 200° C. in $N_2$ and up to 4 volume % $H_2$ for a brief period of time, such as up to five minutes, e.g., about 30 seconds to about 180 seconds, to reduce oxides formed on the upper surface of the inlaid copper, thereby presenting a cleaner surface for subsequent capping layer adhesion. Subsequently, a second annealing step is conducted at a temperature no greater than that used in the first annealing step but in an atmosphere of $N_2$ and up to no more than 1 vol. % $H_2$, e.g., in the absence of $H_2$.

In accordance with the embodiments of the present invention, annealing can be implemented prior to conducting CMP. In other embodiments of the present invention, annealing can be implemented subsequent to CMP.

As employed throughout this application, the symbol Cu is intended to encompass high purity elemental copper as well as Cu-based alloys, such as Cu alloys containing minor amounts of tantalum, indium, tin, zinc, manganese, titanium, magnesium, chromium, titanium, germanium, scandium, platinum, magnesium aluminum or zirconium.

In accordance with embodiments of the present invention, Cu may be inlaid in a wide variety of dielectric materials employed as interlayer dielectrics. Advantageously, dielectric materials for use as interlayer dielectrics in accordance with embodiments of the present invention can comprise dielectric materials with lower values of permittivity and those mentioned above, in order to reduce interconnect capacitance. The expression "low-k" material has evolved characterized materials with a dielectric constant less than about 3.9, e.g., about 3.5 or less. The value of a dielectric constant expressed herein is based upon the value of (1) for a vacuum.

A wide variety of low-k materials can be employed in accordance with embodiments of the present invention, both organic and inorganic. Suitable organic materials include various polyamides and BCB. Other suitable low-k dielectrics include poly(arylene)ethers, poly(arylene)ether azoles, arylene-N, polyamides, polynapthalene-N, polyphenylquinoxalines (PPQ), polyphenyleneoxide, polyethylene and polypropylene. Other low-k materials suitable for use in embodiments of the present invention include $FO_x$™ (HSQ-based), XLK™ (HSQ-based), and porous SILK™, an aromatic hydrocarbon polymer (each available from Dow Chemical Co., Midland, Mich.); Coral™, a carbon-doped silicon oxide (available from Novellus Systems, San Jose, Calif.), silicon-carbon-oxygen-hydrogen (SiCOH) organic dielectrics, Black-Diamond™ dielectrics, Flare™, an organic polymer, HOSP™, a hybrid sioloxane-organic polymer, and Nanoglass™, a nanoporous silica (each available from Honeywell Electronic Materials) and Halogen-doped (e.g., fluorine-doped) silicon dioxide derived from tetraethyl orthosilicate (TEOS) and fluorine-doped silicate glass (FSG).

Figure 2:
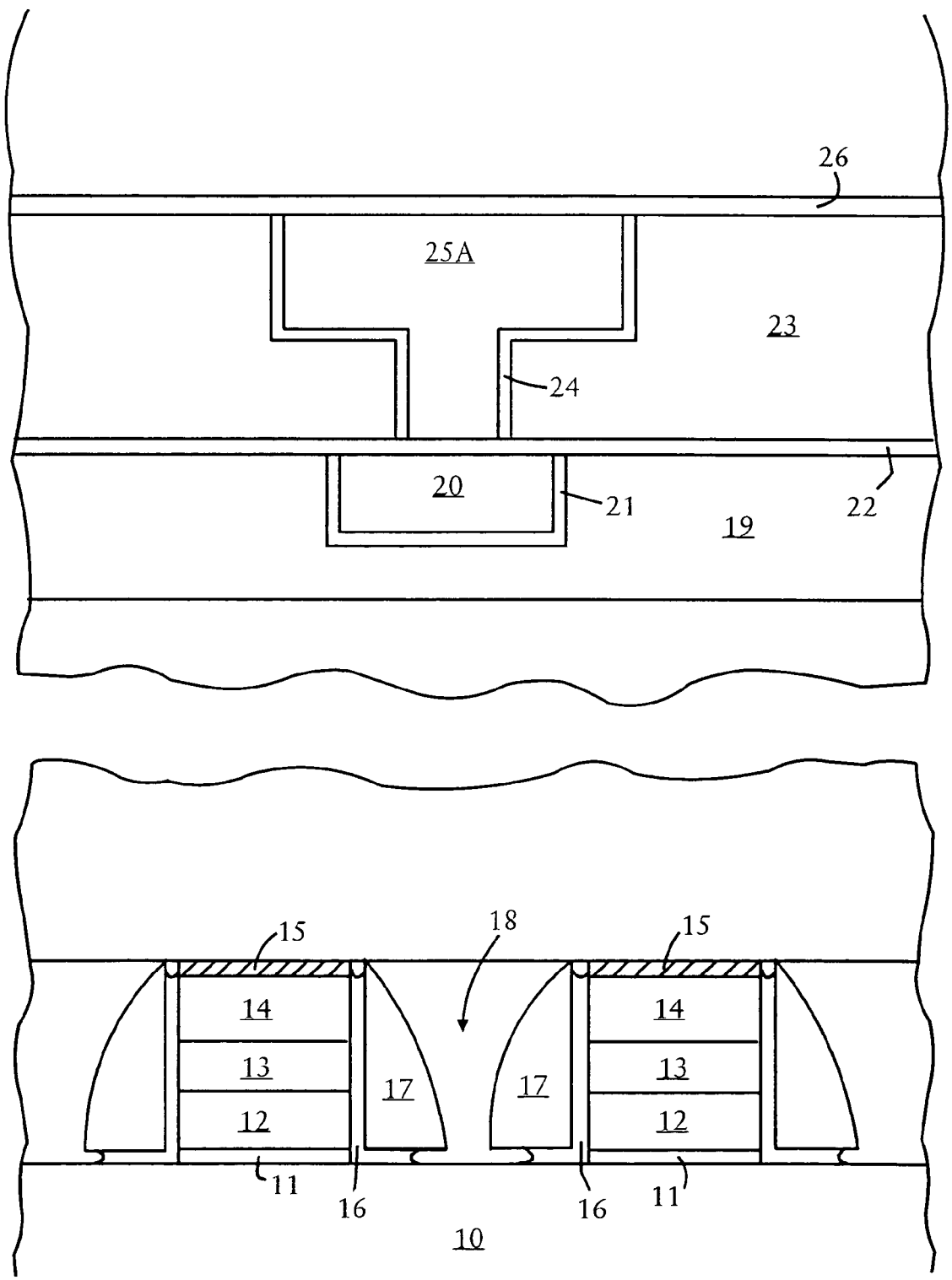

An embodiment of the present invention is schematically illustrated in FIGS. 1 and 2. Adverting to FIG. 1, closely spaced apart gate electrode stacks of non-volatile transistors are formed on substrate 10. For illustrative convenience, the associated source/drain regions and local interconnects are not depicted. Each gate electrode stack comprises a tunnel oxide 11, a floating gate electrode 12, an interpoly dielectric layer 13, such as a silicon oxide/silicon nitride/silicon oxide (ONO) stack, and a control gate electrode 14 formed thereon. Typically, sidewall spacers are formed on side surfaces of the gate electrode stacks. Such sidewall spacers can include a silicon oxide liner 16 and silicon nitride spacers 17. A metal silicide layer 15, such as cobalt silicide or nickel silicide, can be formed on the control gate electrode 14. Reference character 18 denotes the first interlayer dielectric (ILDo), typically a layer of silicon oxide doped with boron and phosphorous, such as boron, phosphorous doped silicon oxide derived from tetraethyl orthosilicate (BP-TEOS).

There is also schematically illustrated in FIG. 1 an upper portion of an interconnect structure which comprises an interlayer dielectric (ILD) 19, such as a low-k interlayer dielectric, having inlaid Cu 20 therein. Reference character 21 denotes a diffusion barrier material, such as tantalum, tantalum nitride, tungsten or tungsten nitride. A capping layer 22, such as silicon nitride, is deposited on the upper surface of inlaid Cu 20. Another ILD 24, such as another low-k dielectric layer, is deposited at an upper interconnect level, a dual damascene opening is formed therein, and a diffusion barrier 26, such as tantalum or tantalum nitride, titanium or titanium nitride, deposited to line the opening. A layer of Cu 25 is then deposited forming an over burden. In accordance with an embodiment of the present invention, the inlaid Cu is annealed to effect grain growth thereby reducing stresses, but in an atmosphere of $N_2$ and no more than 1 vol. % $H_2$, such as in the absence of $H_2$, at a temperature of less than about 200° C., e.g., about 100° C. to about 150° C.

Adverting to FIG. 2, CMP is implemented to form an inlaid Cu 25A, and a capping layer 26, such as silicon nitride, is deposited. In embodiments of the present invention, annealing of the inlaid Cu can be conducted after CMP and before deposition of the silicon nitride capping layer. In such embodiments, after CMP the upper surface of the inlaid copper 25A can be exposed to an ammonia plasma, typically for about for about 30 seconds to about 60 seconds, to remove copper oxide that would otherwise adversely impact adhesion.

In another embodiment of the present invention, the inlaid Cu 25A illustrated in FIG. 2 is annealed in two stages before applying capping layer 26. A first annealing is conducted in an atmosphere of $N_2$ and up to 4 vol. % $H_2$, at a temperature less than about 200° C. for a brief period of time, such as up to five minutes, e.g., about 30 seconds to about 180 seconds. During this first anneal, a minor amount of hydrogen ions are generated to remove any oxide formed on the upper surface of the Cu. After this initial flash anneal, a second annealing is conducted in an atmosphere of $N_2$ and up to 1 volume % $H_2$, such as any total absence of $H_2$, at a temperature of less than 200° C., e.g., of about 100° C. to about 150° C., for a period of time sufficient to stress relieve the inlaid copper by effecting grain growth, such as about 10 minutes to about 100 minutes.

Mirrorbit technology is fundamentally different from and more advanced than conventional floating gate technology, thereby enabling innovative and cost-effective advancements. A mirrorbit cell doubles the intrinsic density of a flash memory array by storing two physically distinct bits on opposite sides of a memory cell, typically within the nitride layer of the ONO stack of the gate dielectric layer separating the gate from the substrate. Each bit within a cell serves as a binary unit of data, e.g., either 1 or 0, mapped directly to the memory array. Reading or programming one side of a memory cell occurs independently of whatever data is stored on the opposite side of the cell. Consequently, mirrorbit technology delivers exceptional read and write performance for wireless and embedded markets.

Figure 3:
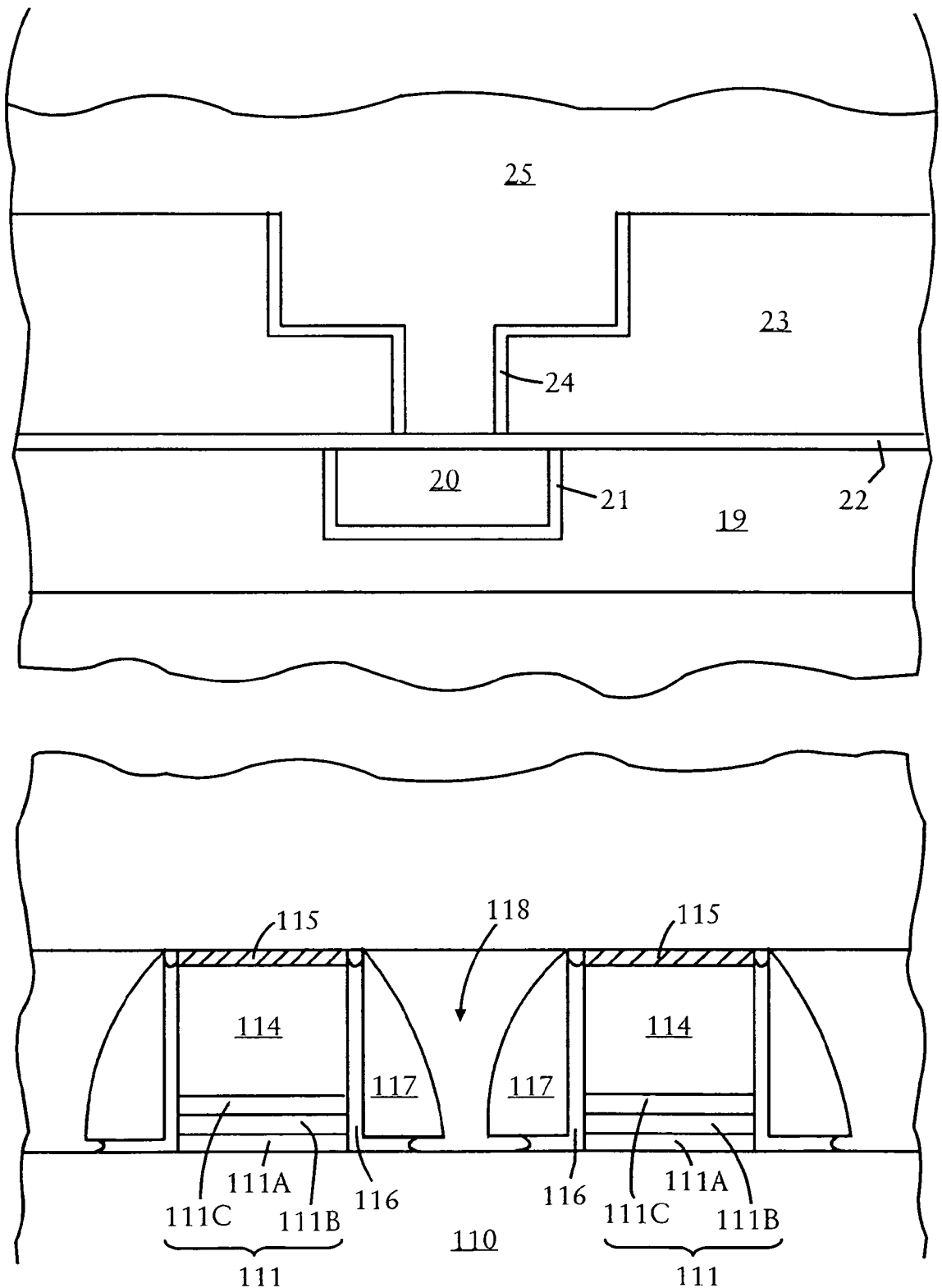
FIGS. 3 and 4 schematically illustrate another embodiment of the present invention involving a mirrorbit device.
Figure 4:
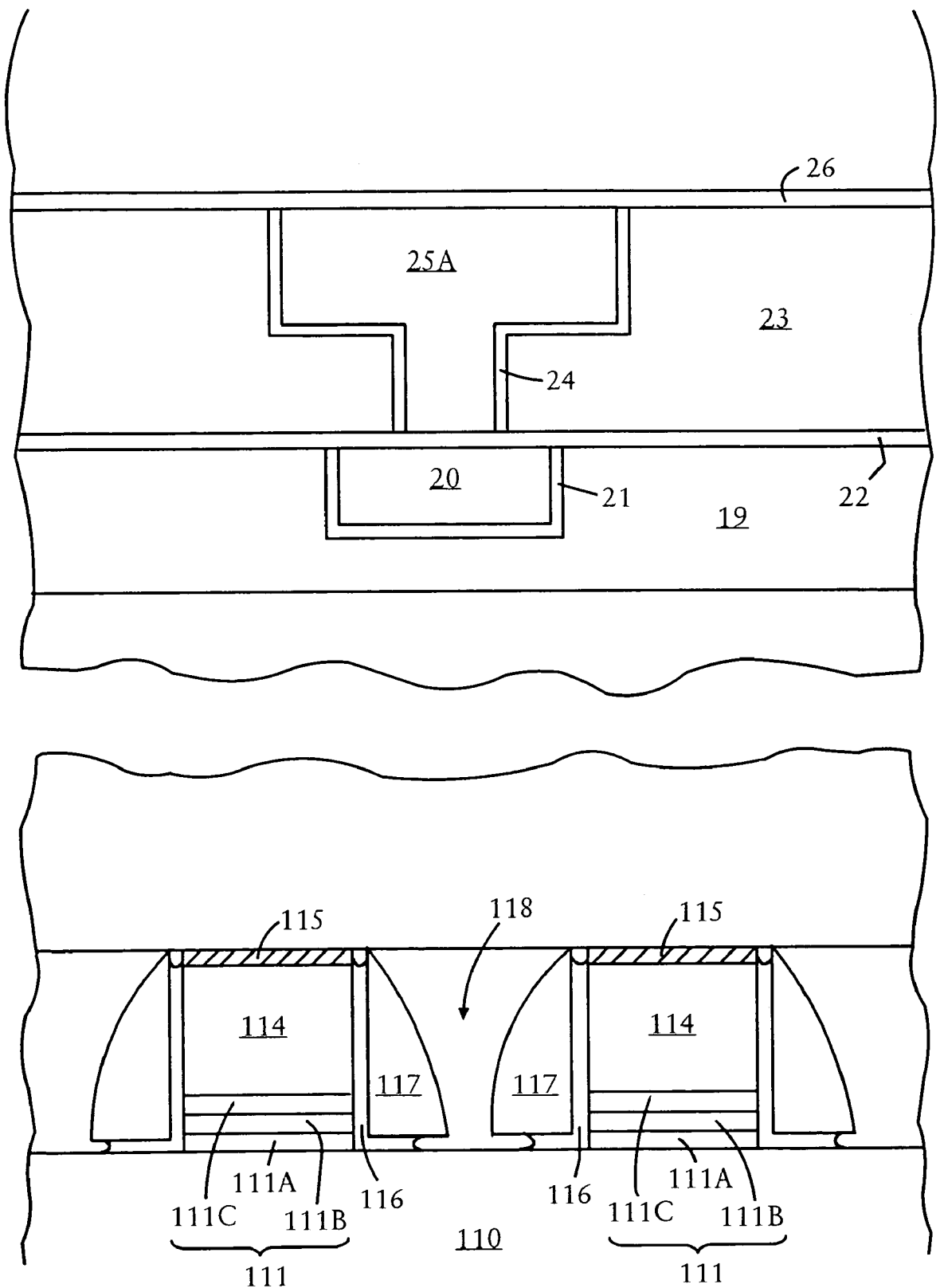

FIGS. 3 and 4 illustrate another embodiment of the present invention that is similar to that illustrated in FIGS. 1 and 2, except that the Cu interconnect structure is provided in a mirrorbit device rather than a floating gate device. Adverting to FIG. 3, spaced apart gate electrode stacks of a mirrorbit device are formed on substrate 110. For illustrative convenience, the associated source/drain regions are not illustrated. Each gate electrode stack comprises a gate dielectric layer 111 formed of a composite ONO stack comprising silicon oxide layer 111A, silicon nitride layer 111B, and silicon oxide layer 111C, and a gate electrode 114 formed thereon. Typically, sidewall spacers are formed on side surfaces of the gate electrode stack, which sidewall spacers can include a silicon oxide liner 116 and silicon nitride spacers 117. A metal silicide layer 115, such as cobalt silicide or nickel silicide, can be formed on the gate electrode 114. Reference character 118 denotes the first interlayer dielectric ($ILD_0$), such as a layer of silicon oxide doped with boron and phosphorus, such as boron, phosphorus doped silicon oxide derived from tetraethyl or thosilicate (BP-TEOS).

There is also schematically illustrated in FIG. 3 an upper portion of an interconnect structure which comprises an interlayer dielectric (ILD) 19, such as a low-k interlayer dielectric, having inlaid Cu 20 therein. Reference character 21 denotes a diffusion barrier material, such as tantalum, tantalum nitride, tungsten or tungsten nitride. A capping layer 22, such as silicon nitride, is deposited on the upper surface of inlaid Cu 20.

Another ILD 24, such as another low-k dielectric layer, is deposited at an upper interconnect level, a dual damascene opening is formed therein, and a diffusion barrier 26, such as tantalum or tantalum nitride, titanium or titanium nitride, deposited to line the opening. A layer of Cu 25 is then deposited forming an overburden. In accordance with an embodiment of the present invention, as in the embodiment illustrated in FIGS. 1 and 2, annealing is conducted at an atmosphere of $N_2$ and up to 1 vol. % $H_2$, at a temperature of up to 200° C., e.g., about 100° C. to about 150° C., for a suitable period of time, e.g., about 10 minutes to about 100 minutes to stress relieve the inlaid Cu by grain growth.

Adverting to FIG. 4, CMP is implemented and a capping layer 26, such as silicon nitride is formed over inlaid Cu 25A. In accordance with the embodiments of the present invention, annealing of the inlaid copper can be implemented either before CMP or subsequent to CMP and prior to deposition of the capping layer 26. In the embodiments where annealing is conducted subsequent to CMP and prior to capping layer deposition, the upper surface of the inlaid Cu 25A can be treated with an ammonia plasma, as for about 30 seconds to about 60 seconds, to remove any copper oxide which would otherwise adversely impact adhesion of capping layer 26.

Alternatively, annealing can be implemented in two stages. During the first annealing stage, conducted after CMP and before capping layer deposition, heating is conducted in an atmosphere of $N_2$ and up to 4 vol. % $H_2$, at a temperature no greater than 200° C., e.g., about 100° C. to about 150° C., for a short period of time, such as less than 5 minutes, e.g., about 30 seconds to about 180 seconds. The small amount of hydrogen ions generated reduce any copper oxides formed on the upper surface of inlaid Cu 25A, thereby improving adhesion of the capping layer. Subsequently, a second anneal is implemented by heating in an atmosphere of $N_2$ and reduced $H_2$, such as up to 1 vol. % $H_2$, e.g., the total absence of $H_2$, at a temperature of less than 200° C., e.g., about 100° C. to about 150° C., for an appropriate period of time to effect stressed grain growth, thereby stress relieving the inlaid Cu, such as about 10 minutes to 100 minutes.

The present invention enables the fabrication of semiconductor memory device, particularly flash memory devices, such as mirrorbit devices, exhibiting improved data retention, with associated reliable Cu interconnects due to controlled back end processing designed to reduce hydrogen ion generation and diffusion. Semiconductor memory devices produced in accordance with the present invention enjoy industrial applicability in various commercial electronic devices, such as computers, mobile phones, cellular handsets, smartphones, set-top boxes, DVD players and records, gaming systems, and digital cameras. In the preceding detailed description, the present invention is described with reference to specifically exemplary embodiments thereof. It will, however, be evident that various modifications and changes may be made thereto without departing from the broader spirit and scope of the present invention, as set forth in the claims. The specification and drawings are, accordingly, to be regarded as illustrative and not restrictive. It is understood that the present invention is capable of using various other combinations and environments and is capable of changes or modifications within the scope of the inventive concept as expressed herein.

What is claimed is:

1. A method of fabricating a semiconductor device, the method comprising:

depositing a layer of copper (Cu) or a Cu alloy in an opening in a dielectric layer, the opening being a dual damascene opening;

conducting chemical mechanical polishing (CMP) on an overburden formed in the depositing;

conducting a first anneal by heating the deposited layer of Cu or Cu alloy in an atmosphere of nitrogen ($N_2$) and 0 to 4 vol. % hydrogen ($H_2$), at a temperature of about 100° C. to less than 200° C. for up to 5 minutes; and, subsequently, conducting a second anneal by heating the deposited layer of Cu or Cu alloy in $N_2$ without $H_2$ at a temperature of about 100° C. to less than 200° C., wherein both the first and second anneals are conducted after the CMP; and wherein the semiconductor device comprises a mirrorbit device having a gate dielectric layer, comprising an oxide/nitride/oxide (ONO) stack on a substrate, and a gate electrode on the ONO stack.

2. The method according to claim 1, wherein:
the dielectric layer has a dielectric constant (k) no greater than 3.9.

3. The method according to claim 1, wherein the second anneal is conducted at a temperature no greater than that used in the first anneal.

4. The method according to claim 1, wherein the first anneal is conducted in an atmosphere without $H_2$.

5. The method according to claim 1 wherein at least one of the first anneal or the second anneal is conducted at a temperature from about 100° C. to about 150° C.

6. The method according to claim 1, wherein:
the dielectric layer has a dielectric constant (k) equal to or less than 3.5.

* * * * *